United States Patent
Gao et al.

(10) Patent No.: US 9,001,473 B1
(45) Date of Patent: Apr. 7, 2015

(54) TMR/CPP READER FOR NARROW READER GAP APPLICATION

(71) Applicant: HGST Netherlands B.V., Amsterdam (NL)

(72) Inventors: Zheng Gao, San Jose, CA (US); James Mac Freitag, Sunnyvale, CA (US); Kuok San Ho, Redwood City, CA (US); Ching Hwa Tsang, Sunnyvale, CA (US); Kochan Ju, Monte Sereno, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/221,375

(22) Filed: Mar. 21, 2014

(51) Int. Cl.
 *G11B 5/127* (2006.01)
 *G11B 5/39* (2006.01)

(52) U.S. Cl.
 CPC .................................... *G11B 5/3945* (2013.01)

(58) Field of Classification Search
 USPC ............... 360/123.09, 123.07, 123.1, 123.03, 360/123.3, 123.05, 123.06, 123.02, 324.11, 360/324.12, 324.1, 324.2; 29/603.14, 29/603.12, 603.08
 See application file for complete search history.

(56) References Cited

U.S. PATENT DOCUMENTS

| | | | |
|---|---|---|---|
| 6,721,139 B2 | 4/2004 | Gill | |
| 6,724,587 B2 | 4/2004 | Gill | |
| 7,652,856 B2 | 1/2010 | Pinarbasi | |
| 7,751,154 B2 | 7/2010 | Wu | |
| 7,961,440 B2 | 6/2011 | Gill et al. | |
| 8,395,867 B2 | 3/2013 | Dimitrov et al. | |
| 2003/0011943 A1* | 1/2003 | Webb et al. ................. | 360/324.1 |
| 2003/0137780 A1* | 7/2003 | Fontana et al. ............ | 360/324.2 |
| 2003/0137781 A1* | 7/2003 | Carey et al. ................ | 360/324.2 |
| 2003/0137782 A1* | 7/2003 | Ho et al. ..................... | 360/324.2 |
| 2003/0179507 A1* | 9/2003 | Freitag et al. .................. | 360/322 |
| 2003/0179509 A1* | 9/2003 | Pinarbasi ...................... | 360/322 |
| 2006/0034013 A1* | 2/2006 | Kato et al. ..................... | 360/128 |
| 2006/0193089 A1* | 8/2006 | Li et al. ..................... | 360/324.11 |
| 2006/0285248 A1* | 12/2006 | Pust et al. ..................... | 360/128 |
| 2007/0014054 A1* | 1/2007 | Zhang et al. ............. | 360/324.12 |
| 2007/0035881 A1* | 2/2007 | Burbank et al. ........... | 360/234.3 |
| 2009/0174968 A1 | 7/2009 | Singleton et al. | |
| 2009/0251828 A1* | 10/2009 | Schreck et al. ............... | 360/319 |
| 2009/0316302 A1* | 12/2009 | Aoki ......................... | 360/234.3 |
| 2010/0157477 A1* | 6/2010 | Morinaga et al. ........ | 360/125.12 |

(Continued)

OTHER PUBLICATIONS

Childress, J. R. et al.; "All-Metal Current-Perpendicular-to-Plane Giant Magnetoresistance Sensors for Narrow-Track Magnetic Recording"; IEEE Transactions on Magnetics, vol. 44, No. 1, Jan. 2008; 5 pages.

*Primary Examiner* — Allen T Cao
(74) *Attorney, Agent, or Firm* — Patterson & Sheridan, LLP (57) ABSTRACT

The embodiments disclosed generally relate to a read head in a magnetic recording head. The read head utilizes a sensor structure having: a pinned magnetic structure recessed from a media facing surface; and a reader gap structure. The reader gap structure has a spacer layer recessed from the media facing surface and disposed on top of the pinned magnetic structure, a recessed first free layer partially recessed from the media facing surface and disposed on top of the barrier layer, a second free layer extending to the media facing surface an disposed on top of the barrier layer, and a cap layer extending to the media facing surface disposed atop the second free layer. The pinned magnetic structure, the spacer, and the first free layer have a common face which is on an angle relative to the media facing surface.

20 Claims, 4 Drawing Sheets

(56) References Cited

U.S. PATENT DOCUMENTS

| | | | |
|---|---|---|---|
| 2010/0226044 A1* | 9/2010 | Iwase | 360/234.3 |
| 2010/0265618 A1* | 10/2010 | Boutaghou et al. | 360/234.3 |
| 2012/0127602 A1* | 5/2012 | Li et al. | 360/75 |
| 2012/0300334 A1* | 11/2012 | Hsiao et al. | 360/59 |
| 2013/0027032 A1 | 1/2013 | Gao et al. | |
| 2014/0035572 A1* | 2/2014 | Karr et al. | 324/252 |
| 2014/0340791 A1* | 11/2014 | Braganca et al. | 360/234.4 |

\* cited by examiner

TMR/CPP READER FOR NARROW READER GAP APPLICATION

BACKGROUND OF THE INVENTION

1. Field of the Invention

Embodiments disclosed herein generally relate to a magnetic read head for use in a hard disk drive.

2. Description of the Related Art

At the heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent to a media facing surface (MFS), such as an air bearing surface (ABS) of the slider causing the slider to ride on an air bearing a slight distance from the surface of the rotating disk. When the slider rides on the air bearing, the write and read heads are employed for writing magnetic transitions corresponding to host data. The read and write heads are connected to a signal processing circuitry that operates according to a computer program to implement the writing and reading functions.

Modern HDDs use tunnel magneto resistance (TMR) read heads. The TMR read head uses magnetic tunnel junctions for sensing magnetically written data on a HDD. The direction of magnetization for a ferromagnetic "free layer" can be switched by an external magnetic field. If the magnetization is in a parallel orientation to a second pinned ferromagnetic film, it is more likely that electrons will tunnel through the insulating film separating them than if they are in an anti-parallel orientation. Consequently, such a junction can be switched between two states of electrical resistance, one with low and one with very high resistance.

The need for ever increased data density is pushing researchers to develop data recording systems that can read and record ever smaller bit lengths in order to increase the density of data recorded on a magnetic medium. The size of a reader gap thickness in the read head is related to the size of the bit length the read head can sense. This has led to a push to decrease the reader gap thickness for the read heads. However, the amount by which the reader gap thickness can be decreased has been limited by physical limitations of sensors and also by the limitations of currently available manufacturing methods.

Future read heads for high density media require a very narrow reader gap. The reader gaps for conventional TMR/CPP read heads cannot meet the requirements for future high density media simply by thinning the functional layers of the read head. Recently, alternative read head structures, such as recessed pinned layers and scissor sensors, have been the focus of development for narrowing the reader gap of the read heads.

The conventional read heads using recessed pinned layers have been considered with various configurations of the pinned layer recessed back from the MFS. As a result, the size of the reader gap can be shrunk approximately 7 nm to about 18 nm. However, aside from fabrication challenges, the reduction in the pinning energy and the stability of the pinned layer at the MFS has been problematic for read heads using the recessed pinned layers.

Read heads using the scissor sensor structure has been developed for many years. Using this technology, the reader gap can be reduced approximately 10 nm to about 14 nm. However, a great challenge related to yield and the sensor stability still remains.

Therefore, there is a need to further reduce the reader gap while still preserving the stability and reliability of the magnetic read head sensor.

SUMMARY OF THE INVENTION

The embodiments disclosed herein relate to a sensor structure having a pinned magnetic structure recessed from a media facing surface and a reader gap structure. The reader gap structure has a spacer layer fully recessed from the media facing surface and disposed on top of the pinned magnetic structure; a first part of free layer partially recessed from the media facing surface and disposed on top of the spacer layer; a second part of free layer extending to the media facing surface an disposed on top of the recessed first free layer; and a cap layer extending to the media facing surface disposed atop the second part of free layer. The seed layer, pinned magnetic structure, the spacer, and the first free layer have a common face which is on an angle relative to the media facing surface.

In another embodiment, a magnetic read head has a bottom shield, a top shield; and a sensor structure disposed between the bottom and top shield. The sensor structure has a pinned magnetic structure recessed from a media facing surface and a reader gap structure. The reader gap structure has a spacer layer fully recessed from the media facing surface and disposed on top of the pinned magnetic structure; a first part of free layer partially recessed from the media facing surface and disposed on top of the spacer layer, a second part of free layer extending to the media facing surface an disposed on top of the recessed first free layer; and a cap layer extending to the media facing surface disposed atop the second free layer. The seed layer, pinned magnetic structure, the spacer, and the first free layer have a common face which is on an angle relative to the media facing surface.

BRIEF DESCRIPTION OF THE DRAWINGS

So that the manner in which the above recited features can be understood in detail, a more particular description of the invention, briefly summarized above, may be reference to embodiments, some of which are illustrated in the appended drawings. It is to be noted, however, that the appended drawings illustrate only typical embodiments and are therefore not to be considered limiting of its scope, for the invention may admit to other equally effective embodiments.

FIG. 4 is a schematic illustration of the read head of FIG. 2, according to a second embodiment To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s). As used herein, a "stitched" layer is a layer formed in two or more separate steps, such as later deposited and joined ("stitched").

Figure 1:
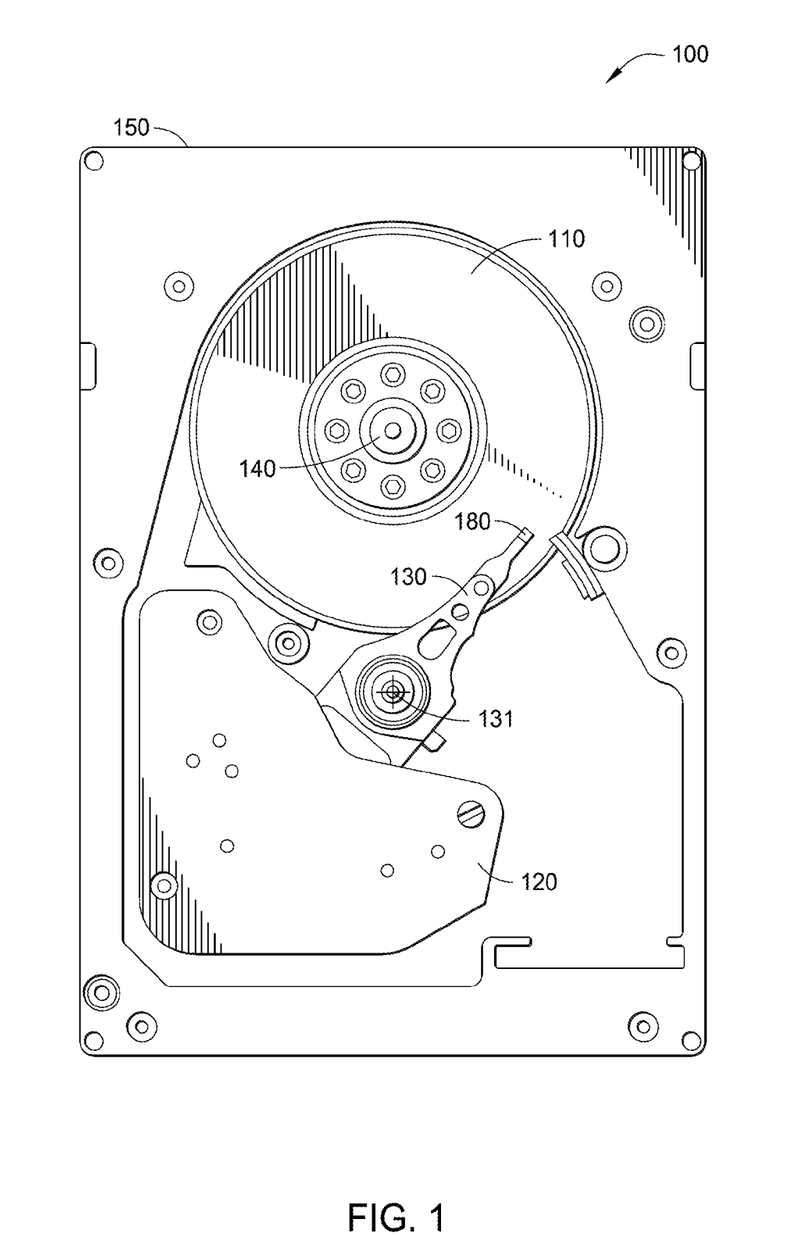
FIG. 1 illustrates an exemplary magnetic disk drive, according to one embodiment.

FIG. 1 illustrates a top view of an exemplary hard disk drive (HDD) 100, according to an embodiment of the invention. As illustrated, HDD 100 may include one or more magnetic disks 110, an actuator 120, actuator arms 130 associated with each of the magnetic disks 110, and a spindle motor 140 affixed in a chassis 150. The one or more magnetic disks 110 may be vertically arranged and coupled with the spindle motor 140.

Magnetic disks 110 may include circular tracks of data on both the top and bottom surfaces of the magnetic disk 110. A magnetic read/write head 180 mounted on a slider may be positioned on a track. As each magnetic disk 110 spins, data may be written on to, and/or read from, the data track. Magnetic read/write head 180 may be coupled to an actuator arm 130 as illustrated in FIG. 1. Actuator arm 130 may be configured to swivel around actuator axis 131 to place magnetic read/write head 180 on a particular data track.

Figure 2:
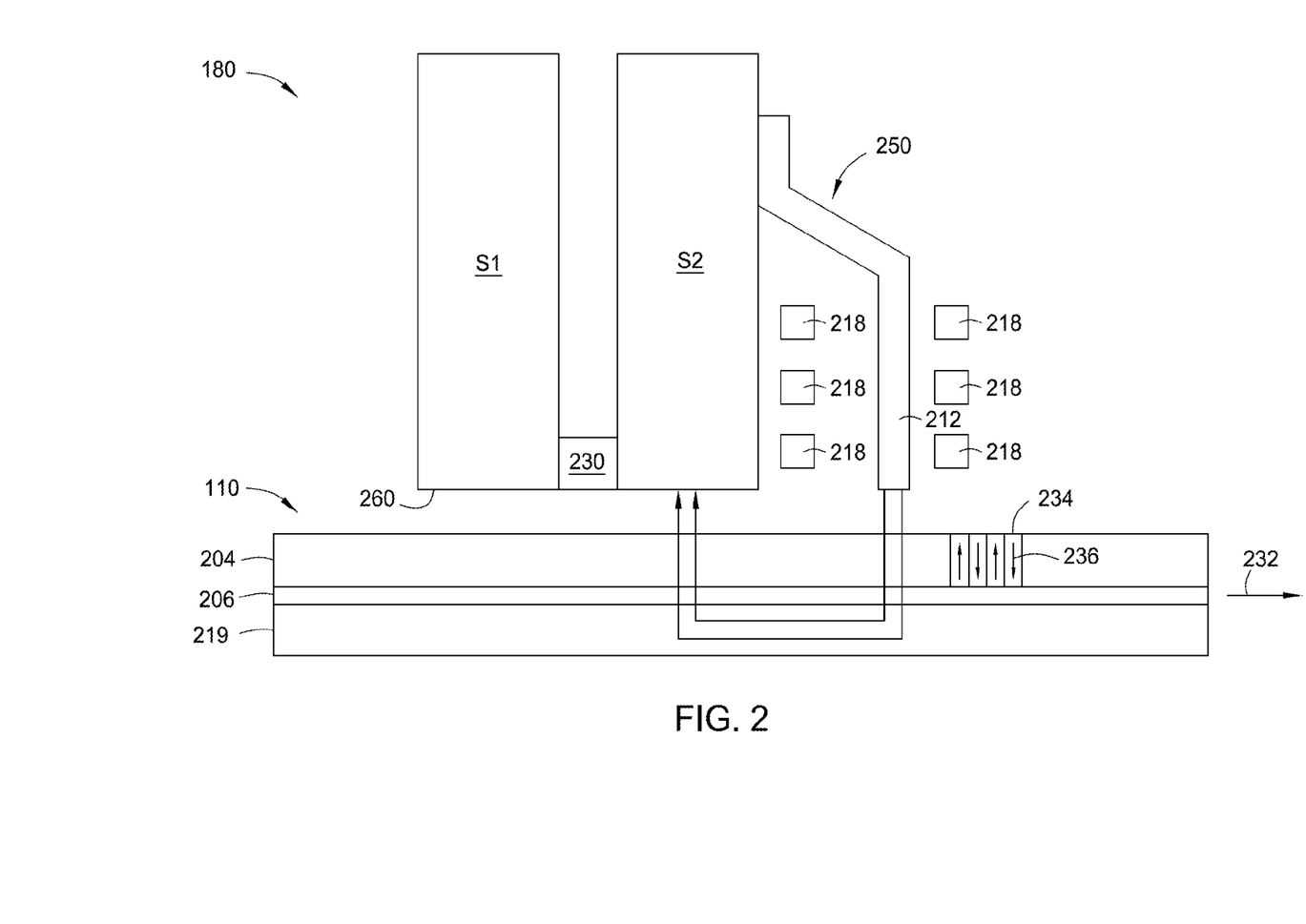
FIG. 2 is a side view of a read/write head and magnetic disk of the disk drive of FIG. 1, according to one embodiment.

FIG. 2 is a fragmented, cross-sectional side view through the center of the magnetic read/write head 180 facing the magnetic disk 110. The magnetic read/write head 180 and magnetic disk 110 may correspond to the magnetic read/write head 180 and magnetic disk 110, shown in FIG. 1.

In some embodiments, the magnetic disk 110 may be a "dual-layer" medium that includes a perpendicular magnetic data recording layer (RL) 204 on a "soft" or relatively low coercivity magnetically permeable under-layer (PL) 206 disposed atop a non-magnetic material 219. The RL 204 is illustrated with perpendicularly recorded or magnetized regions 234, with adjacent regions having magnetization directions, as represented by the arrows 236 located in the RL 204.

The magnetic read/write head 180 includes an MFS 260, such as an ABS, such that the MFS 260 is facing the magnetic disk 110. The magnetic read/write head 180 also includes a magnetic write head 250 and a magnetic read head 230. The magnetic read head 230 is disposed between a bottom shield S2 and a top shield S1. Additionally, the bottom shield S2 may be disposed between the magnetic write head 250 and the magnetic read head 230. The write head 250 includes a magnetic circuit made up of a main pole 212 and a thin film coil 218 shown in the section embedded in the non-magnetic material 219.

In FIG. 2, the magnetic disk 110 moves past the magnetic read/write head 180 in the direction indicated by the arrow 232. The magnetic write head 250 writes bits of information in the adjacent magnetized regions 234 for recording data on the magnetic disk 110. The magnetized bits are detectable by the read head 230 which senses the recorded (magnetized) bits.

Figure 3:
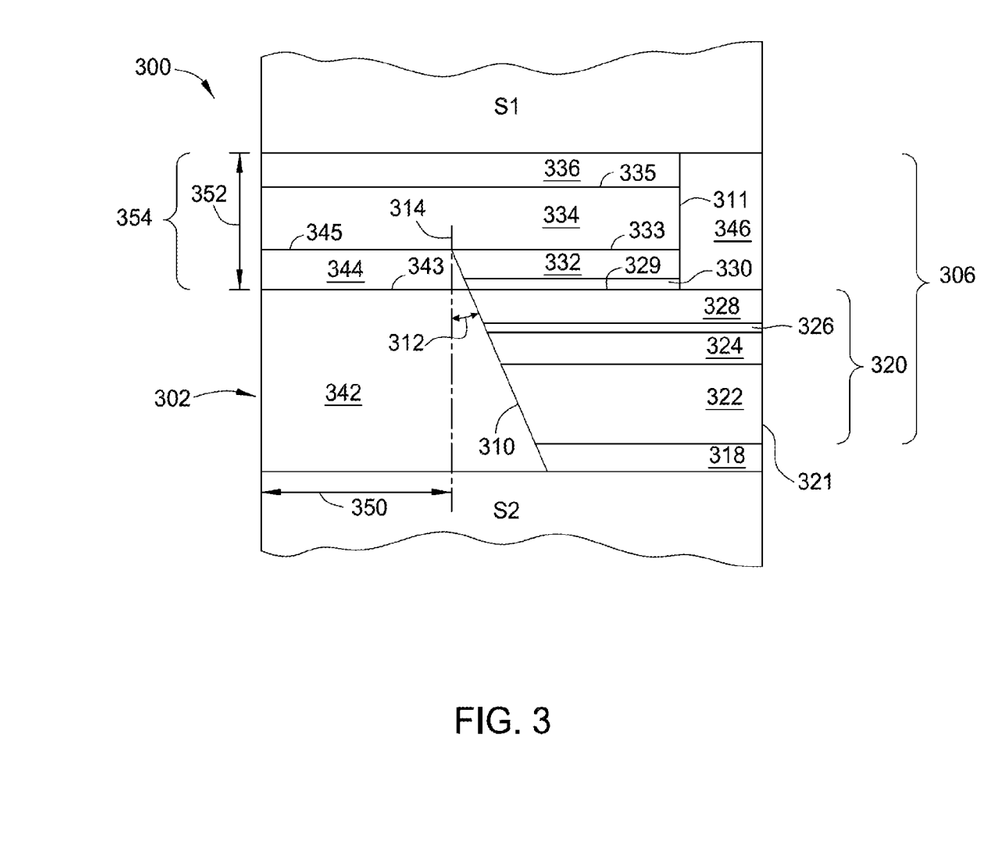
FIG. 3 is a schematic illustration of the read head of FIG. 2, according to one embodiment.
Figure 4:
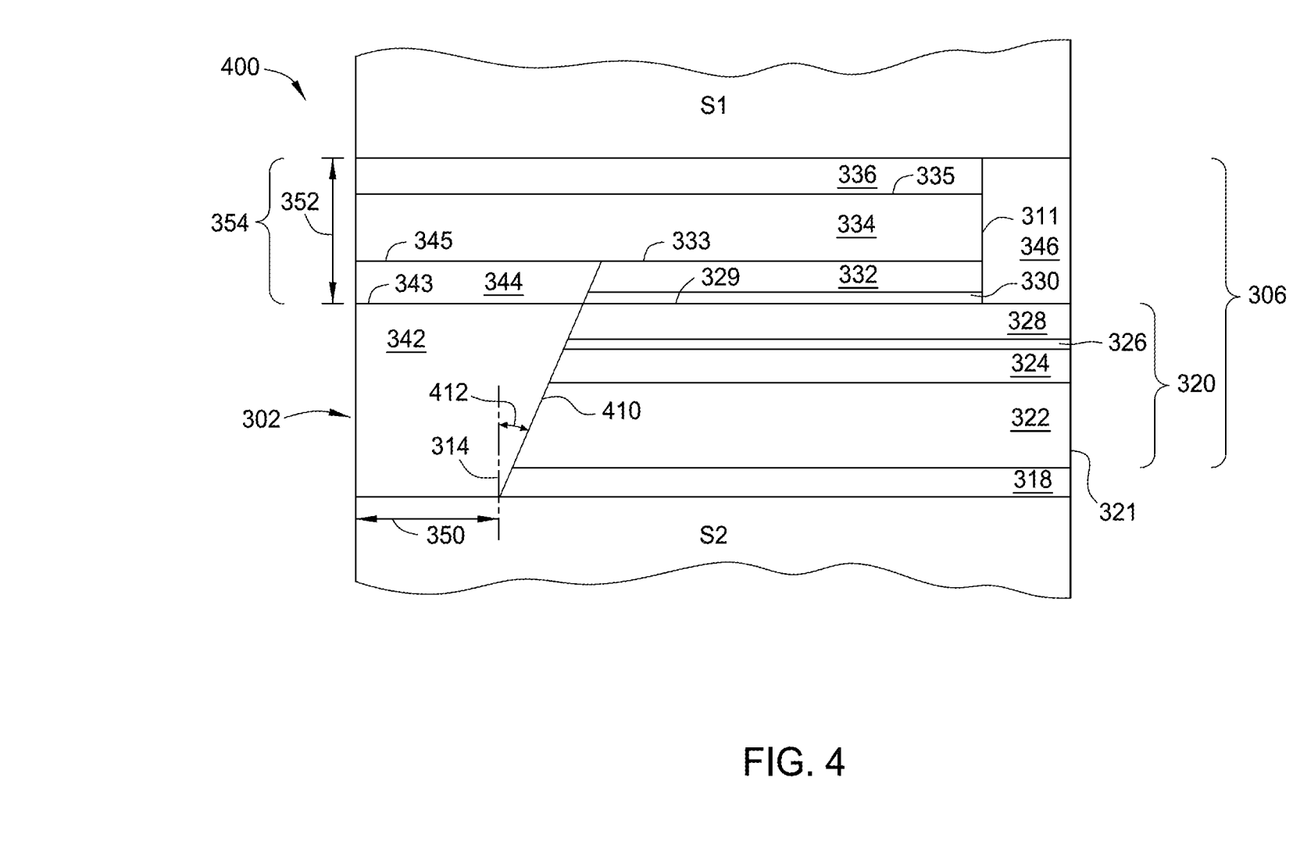

FIGS. 3 and 4 are schematic illustrations of read heads 300, 400 according to separate embodiments of the invention. The read heads 300, 400 may correspond to the magnetic head 230 shown in FIG. 2. The read heads 300, 400 may have a sensor structure 306 with a pinned magnetic structure 320, disposed between the bottom shield S2 and the top shield S1. The pinned magnetic structure 320 has a trapezoidal shape which enhances the shielding effect and permits the reduction of a width 352 for a reader gap 354. The following discussion will be in reference to FIG. 3 but is equally germane to FIG. 4.

In FIG. 3, the bottom shield S2 may comprise a ferromagnetic material such as nickel (Ni), iron (Fe), cobalt (Co), nickel-iron alloy (NiFe), nickel-iron-cobalt alloy (NiFeCo), nickel-cobalt alloy (NiCo), cobalt-iron alloy (CoFe), combinations thereof, or other suitable materials. The bottom shield may have a thickness in or about the micrometer level. The sensor structure 306 is disposed on the bottom shield S2.

The sensor structure 306 may optionally include a seed layer 318. The seed layer 318 may be disposed on the bottom shield S2. The seed layer may comprise ruthenium (Ru), tantalum (Ta), Ru, Ta, Ni(Co)Fe, Ni(Fe)Cr, Co(Ni)FeB, Co(Ni) Fe(Ta, Hf, Zr, W, Nb)(B) and their combination, or other suitable material. The seed layer 318 may have a thickness of about 10 Angstroms to about 500 Angstroms. A thin film deposition process such as DC magnetron sputtering may deposit the seed layer 318.

The pinned magnetic structure 320 is disposed atop the seed layer 318, or the bottom shield S2. The pinned magnetic structure 320 comprises an antiferromagnetic (AFM) layer 322, a first ferromagnetic pinned (AP1) layer 324, a pin spacer layer 326, and a second anti-parallel pinned (AP2) ferromagnetic layer 328. The seed layer 318 and the pinned magnetic structure 320 may be stitched together and recessed from the MFS 302 along with spacer layer 330. A first free layer 332 may additionally be recessed from the MFS 302 and disposed atop the spacer layer 330. The first part of free magnetic layer 332, the spacer layer 330, the pinned magnetic structure 320 and the seed layer 318 share a common face 310. A front shield 342 and a front isolation layer 344 are disposed between the common face 310 and the MFS 302. Although the sensor structure 306 is bottom pinned in FIG. 3, it should be appreciated that the sensor structure 306 may be configured as a top pinned sensor structure.

The AFM layer 322 may be formed on the seed layer 318 and annealed in an aligning magnetic field to pin the orientation of the magnetic field of the AFM layer 322. The AFM layer 322 may comprise platinum (Pt), iridium (Ir), rhodium (Rh), nickel (Ni), iron (Fe), magnesium (Mn), or combinations thereof such as platinum-manganese (PtMn), PtPdMn, NiMn or Iridium-Manganese (IrMn). In one embodiment, the AFM layer 322 is comprised of IrMn and has a thickness of between about 30 Angstroms and about 400 Angstroms such as about 60 Angstroms.

The AP1 layer 324 may be deposited on the AFM layer 322. The AP1 layer 324 may comprise one or more magnetic materials such as, for example NiFe, Co, CoFe, CoFeB, or diluted magnetic alloys. In one embodiment, several magnetic materials may be layered to form the AP1 layer 324. For example, the AP1 layer 324 may be formed from a Co layer disposed atop a CoFe layer which in turn is disposed atop a second Co layer. The AP1 layer 324 may have an overall thickness between about 10 Angstroms and about 100 Angstroms such as about 20 Angstroms.

The pin spacer layer 326 is deposited on the AP1 layer 324. The pin spacer layer 326 may comprise Ruthenium (Ru), rhodium (Rh), iridium (Ir), combinations thereof, or other suitable materials. In one embodiment, the pin spacer layer 326 may be formed from Ru having a thickness between about 3 Angstroms and about 25 Angstroms such as about 4.5 Angstroms.

The AP2 layer 328 may be deposited on the pin spacer layer 326. The inclusion of the AP2 layer 328 on the pin spacer layer 326 may reverse the magnetic field orientation for the pinned magnetic structure 320. Optionally, the pinned magnetic structure 320 may not include the AP2 layer 328 and the pin spacer layer 326. Therefore, the AP2 layer 328 may be used to determine the pinning direction of the pinned magnetic structure 320. For example, the pinned magnetic structure 320 includes AP2 layer 328 and the pinning direction for the pinned magnetic structure 320 may be anti-parallel to the pinning direction of the AP1 324 that is pinned by AFM layer 322. In another example, the pinned magnetic structure 320 does not include an AP2 layer 328 and the pinning direction of the pinned magnetic structure 320 is determined by AP1 324 pinning direction.

The AP2 layer 328 may comprise one or more magnetic materials such as Co(Fe)(Ta, Zr, Hf, W, Nb), Co(Fe)(Ta, Zr, Hf, W, Nb)B, Fe(Co)(Ta, Zr, Hf, W, Nb), Ta, Zr, Hf and their alloys. The AP2 layer 328 has a top surface 329 and may be formed from one or more layers of materials having a thickness between about 10 Angstroms and about 100 Angstroms such as about 20 Angstroms. In one embodiment, several magnetic alloys may be layered to form the AP2 layer 328. For example, the AP2 layer 328 may be formed from a Co(Fe) layer, disposed atop a CoFeB layer, disposed atop a CoFeBTa layer, and finally disposed atop a second Co layer.

The front shield 342 is disposed atop the bottom shield S2 and between the common face 310 and the MFS 302. The front shield 342 has a top surface 343 and may comprise one or more of NiFe, Ni, Co, Fe, their alloys and laminates as well as other suitable materials. The top surface 343 of the front shield 342 may or may not be coplanar with the top surface 329 of the AP2 layer 328. The front shield 342 may have a thickness between about 50 Angstroms and about 500 Angstroms such as about 100 Angstroms. The front shield 342 separates the pinned magnetic structure 320 from the magnetic disk 110 and prevents magnetic interference between the pinned magnetic structure 320 and the magnetic disk 110 (shown in FIGS. 1 and 2). Along the common face 310 of the front shield 342, the front shield 342 tapers in a direction towards the MFS 302 when moving along the common face 310 in a direction from the bottom shield S2 to the top surface 343 of the front shield 342. Thus, in the pinned magnetic structure 320, the AP2 Layer 328 is a closer distance to, or less recessed from, the MFS 302 than the AFM layer 322 is to the MFS 302.

The spacer layer 330 is recessed from the MFS 302 and deposited on top of the sensor structure 320. As the second spacer layer 330 becomes thinner, the magnetic interlayer coupling between adjacent layers increases. In the case of a TMR sensor, the second spacer layer 330 may be formed from material such as MgO, AlO, ZnO, Mg, Zn, GaO, IZO, ITO, Cu, Ag, AnSn, AlCu and their alloys which are dielectric or metal. In one embodiment, the spacer layer 330 comprises MgO with a thickness between about 5 Angstroms and about 100 Angstroms, such as about 10 Angstroms.

The first free magnetic layer 332 is recessed from the MFS 302 and deposited on the spacer layer 330. The first free magnetic layer 332 may comprise one or more of Co, Fe, B, Ta, Hf, Zr, CoB, CoFe, CoFeB, NiFe, and their alloys and/or other suitable materials. The first free magnetic layer 332 has a top surface 333 and may comprise a single layer of magnetic material or multiple layers. For example, the first free magnetic layer 332 may be multilayered and formed from a Co(Fe)B layer deposed atop a CoFe layer. In one embodiment, the first free magnetic layer 332 may have an overall thickness between about 10 Angstroms and about 60 Angstroms such as about 15 Angstroms.

The front isolation layer 344 is disposed atop the front shield 342 and extends from the MFS 302 to the first free magnetic layer 332. The front isolation layer 344 has a top surface 345 wherein the top surface 345 may be coplanar with the top surface 333 of the first free magnetic layer 332. The front isolation layer 344 may comprise one or more of MgO, AlO, TaO, SiN and other dielectric materials and/or metal dielectric laminations. In one embodiment, the front isolation layer 344 may comprise MgO and have a thickness between about 15 Angstroms and about 160 Angstroms such as about 50 Angstroms. As will be discussed below, the dielectric material of the front isolation layer 344 improves the data integrity from electronic and magnetic noise for both the first free magnetic layer 332 and a second free magnetic layer 334.

The common face 310 extends linearly from the bottom shield S2 to the intersection of the top surfaces 333, 345 of the front isolation layer 344 and the first free magnetic layer 332. The common face 310 and the MFS 302 are divergent. The common face 310 may be at an angle 312 from the MFS 302 as shown by phantom line 314. The angle 312 may be between an angle equal or greater than 0 degrees and an angle less than 90 degrees, such as about 30 degrees. In the embodiment shown in FIG. 3, the angle 312 of the common face 310 provides a wider portion 350 of the front shield 342 at the intersection with the bottom shield S2 and a narrower portion at the top surface 343. Thus, the recess of the layers from the MFS 302 decreases from the pinned magnetic structure 320 to the first free magnetic layer 332. This places the first free magnetic layer 332 closer than the pinned magnetic structure 320 to the MFS 302 and also to external magnetic influences. The trapezoidal shape enhances shielding effects to reduce noise.

The second free magnetic layer 334 is deposited on top of the first free magnetic layer 332 and the front isolation layer 344. Unlike the first free magnetic layer 332, the second free magnetic layer 334 is not recessed from the MFS 302. The second free magnetic layer 334 has a top surface 335 and may comprise one or more of Co, Fe, B, Ta, Hf, Zr, CoB, CoFe, CoFeB, NiFe, and their alloys and other suitable materials. The second free magnetic layer 334 may comprise one or more layers. For example, the second free magnetic layer 334 may be multilayered and formed from a NiFe layer deposed atop a Ta, Hf or their alloy with CoFe layer, and deposed atop a Co(Fe)B layer. In one embodiment, the second free magnetic layer 334 may have a thickness between about 10 Angstroms and about 100 Angstroms such as about 50 Angstroms.

The first free magnetic layer 332 and the second free magnetic layer 334 are stitched together. The stitching of the first free magnetic layer 332 and the second free magnetic layer 334 has a combined thickness greater than that of the first antiferromagnetic layer 322.

A cap layer 336 extends from the MFS 302 and is disposed on and extends along the top surface 335 of the second free magnetic layer 334. The cap layer 336 may comprise one or more of Ru, Ta, Ti, Ni(Co)Fe, Hf their alloys, or other suitable materials. The cap layer 336 may comprise a single layer or multiple layers, i.e. laminates. In one embodiment, the cap layer 336 may have a thickness between about 10 angstroms and about 100 angstroms such as about 15 Angstroms.

The first free magnetic layer 332, the spacer layer 330, second free magnetic layer 334, and the cap layer 336 have in common a backside 311. The backside 311 may be recessed from a rear surface 321 of the read head 300. The backside 311 may or may not be nearly parallel with both the MFS 302 and the rear surface 321.

A back isolation layer 346 is formed in the space from the backside 311 to the rear surface 321. Thus, the back isolation layer 332 is formed between the rear surface 321 of the read head 300 and the first free magnetic layer 332, the spacer layer 330, the second free magnetic layer 334, and the cap layer 336. Material from the first free magnetic layer 332 and the second free magnetic layer 334 and the cap layer 336 may be removed, exposing a portion of the AP2 layer 328. The material removal may be performed by etching, milling or any suitable material removal method. In one embodiment, the first free magnetic layer 332, the second free magnetic layer 334 and the cap layer 336 is milled to form the back isolation layer 346. The back isolation layer 346 may be adjacent to the backside 311 and extend to the rear surface 321 of the read head 300. The back isolation layer 346 may comprise one or more of AlO, TaO, SiN, MgO or other dielectric suitable material. In one embodiment, the back isolation layer 346 is comprised of AlO and has a thickness between about 80 angstroms and about 200 angstroms, such as 100 angstroms.

A top shield S1 may be disposed on the cap layer 336 and the back isolation layer 346 of the sensor structure 306. The top shield S1 may comprise a ferromagnetic material such as nickel (Ni), iron (Fe), cobalt (Co), nickel-iron alloy (NiFe), nickel-iron-cobalt alloy (NiFeCo), nickel-cobalt alloy (NiCo), cobalt-iron alloy (CoFe), combinations thereof, or other suitable materials either through PVD sputtering or plating. In one embodiment, the top shield S1 may be similar in material and thickness to the bottom shield S2. In another embodiment, the top shield S1 may be dissimilar in material and thickness to the bottom shield S2.

The reader gap 354 comprises the cap 336, second free magnetic layer 334, first free magnetic layer 332, and the spacer 330. This width 352 of the reader gap 354 determines the density of the readable material. For example, the reader gap 354 having a small or narrow width 352 is capable of reading higher density media then a reader gap 354 with a larger or wider width 352. The width 352 of the reader gap 354 may be between about 4 nm and about 12 nm such as about 8 nm. The reader gap 354 of the sensor structure 306 is capable of achieving 4 nm and smaller widths 352. The reader gap 354 is much narrower than current (conventional) scissor designed read heads, allowing for greater media density without the stability issues found in the scissor designed read heads.

FIG. 4 shows a read head 400 similarly configured to the read head 300. The read head 400 has a common face 410 that extends from the bottom shield S2 to the intersection of the top surfaces 333, 345 of the front isolation layer 344 and the first free magnetic layer 332. The common face 410 is similar to common face 310 of FIG. 3 and is divergent with the MFS 302. The common face 410 may have an angle 412 from the MFS 302 as shown by phantom line 314. The angle 412 may be in a negative angle in the range between about 0 degrees and about greater than negative 90 degrees, such as about negative 30 degrees. Thus, where the angle 312 swings in a positive direction, or counter clockwise, from phantom line 314, angle 412 swings in a negative direction, or clockwise, from the phantom line 314.

Along the common face 410 of the front shield 342, the front shield 342 tapers in a direction away from the MFS 302 when moving along the common face 410 in a direction from the bottom shield S2 to the top surface 343 of the front shield 342. Thus, in the pinned magnetic structure 320 of read head 400, the AP2 layer 328 is a farther distance to, or more recessed from, the MFS 302 than the AFM layer 322 is to the MFS 302.

A reader gap 354 for the read head 400 is similar to that of read head 300 shown in FIG. 3. The width 352 of the reader gap 354 is very narrow and capable of reading high density media. The reader gap 354 may have a width 352 between about 4 nm and about 12 nm. The reader gap 354, for the read head 400, is capable of obtaining the widths 352 of 4 nm and smaller.

Therefore, it has been shown where the reader gap of FIG. 3 and FIG. 4 may be significantly narrowed by recessing the pinning structure along with the first of the two free magnetic layers. The stitching of a recessed first free magnetic layer with a second free magnetic layer which extends to the MFS advantageously extends the capabilities of the sensor structure by narrowing the reader gap for use with media having ultra-high recording densities. The trapezoidal structure of the sensor structure enhances the shielding effect while the two free layers have equal or greater amplitude than that found in conventional sensors. The novel sensor structure maintains the integrity of the pinning strength and the pinning field while eliminating the problems associated with a reduction in the pinning strength found in a conventional stitching processes.

While the foregoing is directed to exemplified embodiments, other and further embodiments of the invention may be devised without departing from the basic scope thereof, and the scope thereof is determined by the claims that follow.

What is claimed is:

1. A sensor structure, comprising:
a pinned magnetic structure recessed from a media facing surface; and
a reader gap structure comprising:
a spacer layer recessed from the media facing surface and disposed on top of the pinned magnetic structure,
a first free layer at least partially recessed from the media facing surface and disposed on top of the spacer layer,
a second free layer extending to the media facing surface and disposed on top of the first free layer, and
a cap layer extending to the media facing surface disposed atop the second free layer; wherein a common face of the pinned magnetic structure, the spacer layer, and the recessed first free layer are oriented on an angle relative to the media facing surface.

2. The sensor structure of claim 1, wherein the angle of the common face is a negative angle greater than −90 degrees.

3. The sensor structure of claim 2, further comprising:
a front shield disposed between the common face and the media facing surface; and
a front isolation layer disposed on the front shield and between the common face and the media facing surface, wherein the second free layer is disposed thereon.

4. The sensor structure of claim 3, wherein the pinned magnetic structure comprises:
a first antiferromagnetic layer,
a first pinned layer first disposed on the first antiferromagnetic layer,
a pin spacer layer; and
a second anti-parallel pinned layer first disposed on the pin spacer layer.

5. The sensor structure of claim 2, wherein the angle for the common face is about 30 degrees.

6. The sensor structure of claim 2, wherein a width of the reader gap structure is between 12 nm and 4 nm.

7. The sensor structure of claim 2, wherein stitching the recessed first free layer and the second free layer result in a combined thickness greater than first antiferromagnetic layer.

8. The sensor structure of claim 1, wherein the angle of the common face is a positive angle less than 90 degrees.

9. The sensor structure of claim 8, further comprising:
a front shield disposed between the common face and the media facing surface; and
a front isolation layer disposed on the front shield and between the common face and the media facing surface, wherein the second free layer is disposed thereon.

10. The sensor structure of claim 9, wherein the pinned magnetic structure comprises:
a first antiferromagnetic layer,
a first ferromagnetic pinned layer first disposed on the first antiferromagnetic layer,
a pin spacer layer; and
a second anti-parallel pinned layer first disposed on the pin spacer layer.

11. The sensor structure of claim 8, wherein the angle of the common face is about 30 degrees.

12. The sensor structure of claim 8, wherein a width of the reader gap structure is between 12 nm and 4 nm.

13. The sensor structure of claim 8, wherein stitching the recessed first free layer and the second free layer result in a combined thickness greater than first antiferromagnetic layer.

14. A magnetic read head, comprising
a bottom shield;
a top shield; and
a sensor structure disposed between the bottom and top shield, the sensor structure comprising:
a pinned magnetic structure recessed from a media facing surface;
a reader gap structure comprising:
a spacer layer recessed from the media facing surface and disposed on top of the pinned magnetic structure,
a first free layer at least partially recessed from the media facing surface and disposed on top of the spacer layer,
a second free layer extending to the media facing surface an disposed on top of the first free layer, and
a cap layer extending to the media facing surface disposed atop the second free layer; wherein a common face of the pinned magnetic structure, the spacer layer, and the first free layer is oriented on an angle relative to the media facing surface.

15. A magnetic read head of claim 14 wherein the angle of the common face is a positive angle less than 90 degrees.

16. A magnetic read head of claim 14 wherein the angle of the common face is a negative angle greater than −90 degrees.

17. The magnetic read head of claim 14, further comprising:
a front shield disposed between the common face and the media facing surface; and
a front isolation layer disposed on the front shield and between the common face and the media facing surface, wherein the second free layer is disposed thereon.

18. The magnetic read head of claim 14, wherein the angle of the common face is about 30 degrees.

19. The magnetic read head of claim 14, wherein a width of the reader gap structure is between 12 nm and 4 nm.

20. The magnetic read head of claim 14, wherein stitching the recessed first free layer and the second free layer result in a combined thickness greater than first antiferromagnetic layer.

* * * * *